(12) United States Patent
Lin

(10) Patent No.: US 8,259,424 B1
(45) Date of Patent: Sep. 4, 2012

(54) THIN-OXIDE DEVICE PROTECTION CIRCUITS FOR DATA CONVERTERS

(75) Inventor: Zhou Lin, San Jose, CA (US)

(73) Assignee: Augusta Technology, Inc., George Town, Grand Cayman (KY)

( * ) Notice: Subject to any disclaimer, the term of this patent is extended or adjusted under 35 U.S.C. 154(b) by 227 days.

(21) Appl. No.: 12/606,951

(22) Filed: Oct. 27, 2009

Related U.S. Application Data

(60) Provisional application No. 61/108,702, filed on Oct. 27, 2008.

(51) Int. Cl.
    *H02H 3/22* (2006.01)
(52) U.S. Cl. .......................................... 361/56; 361/111
(58) Field of Classification Search ...................... 361/56, 361/111
    See application file for complete search history.

(56) References Cited

U.S. PATENT DOCUMENTS

| 7,723,962 B2 * | 5/2010 | Parkes et al. ..................... 322/28 |
| 2010/0315748 A1 * | 12/2010 | Kwong et al. .................. 361/56 |

OTHER PUBLICATIONS

Abo, et al., "A 1.5-V, 10-bit, 14.3-MS/s CMOS Pipeline Analog-to-Digital Converter," IEEE Journal of Solid-State Circuits, pp. 509-606, vol. 34, No. 5, May 1999, IEEE, Honolulu, HI, USA.
Chiu, et al., "A 14-b 12-MS/s CMOS Pipeline ADC With Over 100-dB SFDR," IEEE Journal of Solid-State Circuits, pp. 2139-2151, vol. 39, No. 12, Dec. 2004, IEEE, San Francisco, CA, USA.

* cited by examiner

*Primary Examiner* — Danny Nguyen
(74) *Attorney, Agent, or Firm* — Richard A. Dunning, Jr.

(57) ABSTRACT

One embodiment features an electrical circuit comprising: a high-voltage input configured to receive a high voltage into the electrical circuit; a low-voltage input configured to receive a low voltage into the electrical circuit; a thin-oxide circuit comprising a thin-oxide metal-oxide-semiconductor field-effect transistor (MOSFET); and a protection circuit configured to protect the thin-oxide circuit from the high voltage, wherein the protection circuit comprises a thick-oxide MOSFET clamp circuit, and an adaptive voltage reference circuit configured to provide an adaptive reference voltage, wherein the thick-oxide MOSFET clamp circuit is biased by the adaptive reference voltage.

5 Claims, 5 Drawing Sheets

US 8,259,424 B1

THIN-OXIDE DEVICE PROTECTION CIRCUITS FOR DATA CONVERTERS

CROSS-REFERENCE TO RELATED APPLICATIONS

This application claims benefit of U.S. Provisional Patent Application Ser. No. 61/108,702 filed Oct. 27, 2008, the disclosure thereof incorporated by reference herein in its entirety.

BACKGROUND

The present disclosure relates generally to electrical circuits. More particularly, the present disclosure relates to over-voltage protection of thin-oxide metal-oxide-semiconductor field-effect transistors (MOSFET) in circuits such as data converters.

Using different voltages to power different circuit segments is common in VLSI designs for data converters, including analog-to-digital converters (ADC) and digital-to-analog converters (DAC). The main purpose for this approach is to reduce power consumption. However, this approach provides over-voltage protection challenges for thin-oxide devices within the interfaces between the power domains. Theoretically the power up sequence could be controlled by an external power management unit, for example in portable devices. For instance, the system power could be sequenced from the highest power (for example, 3.3V) to the lowest power (for example, 1.2V). However for some applications, the power sequence is difficult to control due to other constraints. Therefore, internal circuits must have the capability to accommodate the different power sequences.

In modern submicron CMOS processes, reliability requirements for the power domain interfaces specify certain over-voltage device tolerance limits. Several failure mechanisms can occur when a voltage higher than the maximum voltage limit is applied upon either the gate or drain of the transistor devices.

A common solution to the problem is to put diode clamps in the power domain interfaces. However, in some applications such as data converters, high linearity is required within the signal paths. Accordingly, there is a need for a circuit-level solution.

SUMMARY

In general, in one aspect, an embodiment features an electrical circuit comprising: a high-voltage input configured to receive a high voltage into the electrical circuit; a low-voltage input configured to receive a low voltage into the electrical circuit; a thin-oxide circuit comprising a thin-oxide metal-oxide-semiconductor field-effect transistor (MOSFET); and a protection circuit configured to protect the thin-oxide circuit from the high voltage, wherein the protection circuit comprises a thick-oxide MOSFET clamp circuit, and an adaptive voltage reference circuit configured to provide an adaptive reference voltage, wherein the thick-oxide MOSFET clamp circuit is biased by the adaptive reference voltage.

Embodiments of the electrical circuit can include one or more of the following features. Some embodiments comprise a first amplifier powered by the high voltage, wherein the first amplifier comprises an output electrically coupled to the thin-oxide circuit; wherein the thick-oxide MOSFET clamp circuit comprises a first thick-oxide MOSFET, wherein a source of the first thick-oxide MOSFET is electrically coupled to the output of the first amplifier, and wherein the adaptive voltage reference circuit provides the adaptive reference voltage to a gate of the first thick-oxide MOSFET. In some embodiments, the output of the first amplifier comprises a differential output; wherein the differential output comprises a first output and a second output; wherein the source of the first thick-oxide MOSFET is electrically coupled to the first output of the first amplifier; wherein the thick-oxide MOSFET clamp circuit further comprises a second thick-oxide MOSFET, wherein a source of the second thick-oxide MOSFET is electrically coupled to the second output of the first amplifier; and wherein the adaptive voltage reference circuit is further configured to provide the adaptive reference voltage to a gate of the second thick-oxide MOSFET. In some embodiments, the adaptive voltage reference circuit further comprises: a second amplifier powered by the high voltage, wherein a common-mode output of the first amplifier is electrically coupled to a positive input of the second amplifier. In some embodiments, the adaptive voltage reference circuit further comprises: a third thick-oxide MOSFET; wherein a source of the third thick-oxide MOSFET is electrically coupled to the high voltage; and wherein an output of the second amplifier is electrically coupled to a gate of the third thick-oxide MOSFET. Some embodiments comprise a data converter comprising the electrical circuit. Some embodiments comprise an integrated circuit comprising the data converter.

The details of one or more implementations are set forth in the accompanying drawings and the description below. Other features will be apparent from the description and drawings, and from the claims.

Figure 1:
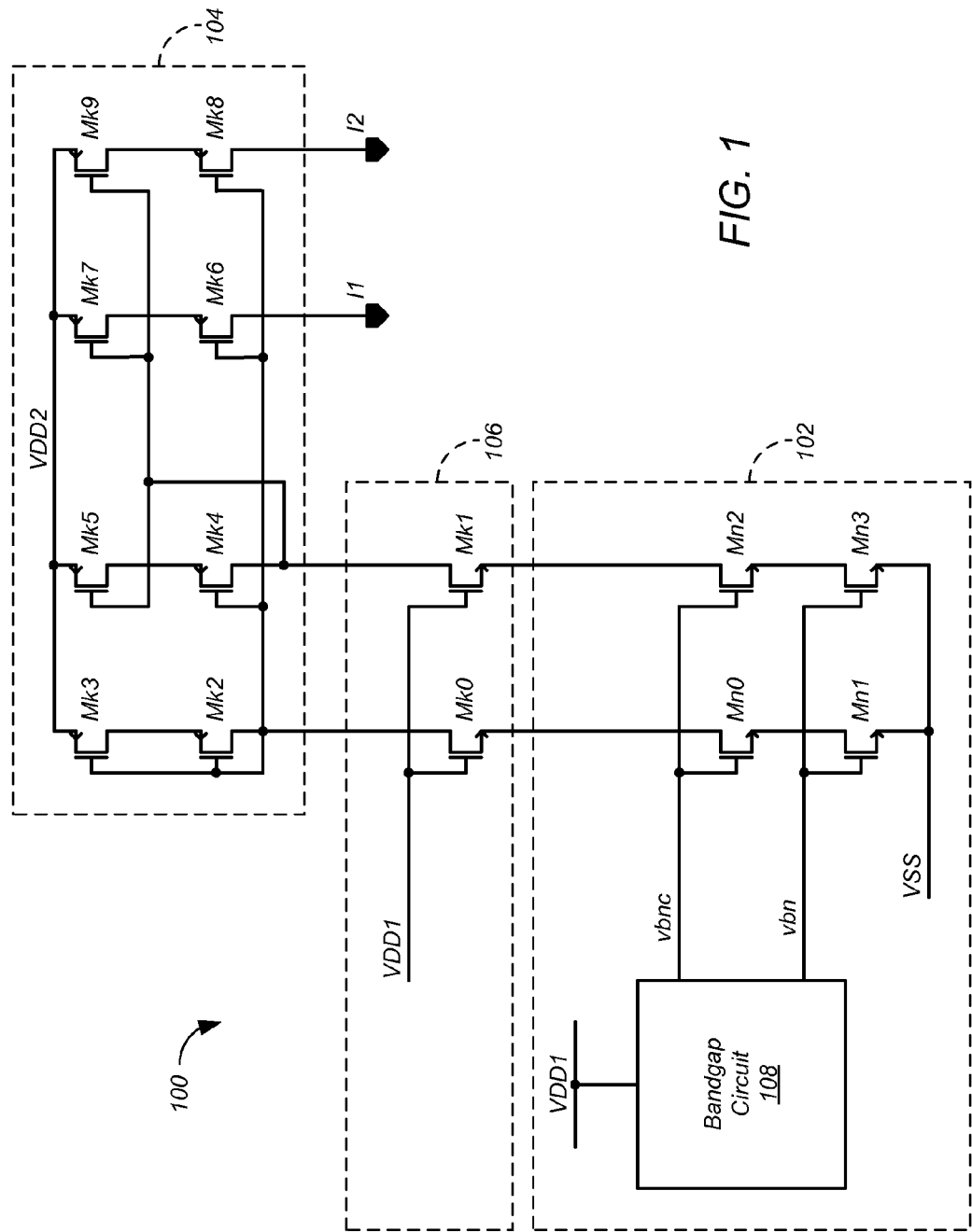
FIG. 1 shows elements of a data converter with a bandgap reference in the low-voltage domain according to some embodiments.

The leading digit(s) of each reference numeral used in this specification indicates the number of the drawing in which the reference numeral first appears.

DETAILED DESCRIPTION

Embodiments of the present disclosure provide electrical circuits, and elements thereof, having multiple power domains and protection circuits to protect thin-oxide devices in the low-voltage domains from over-voltage conditions. In some embodiments, an amplifier with differential outputs in the high-voltage domain drives a thin-oxide circuit in the low-voltage domain. A clamp circuit protects the thin-oxide circuit. The clamp circuit is biased with an adaptive voltage reference based on a common-mode output of the amplifier. Although in the described embodiments, the elements of the circuits are presented in one arrangement, other embodiments may feature other arrangements, as will be apparent to one skilled in the relevant arts based on the disclosure and teachings provided herein. In addition, the techniques disclosed herein are not limited to data converters, but can be applied to a wide range of circuits.

From the system point of view, it is better to place more functional blocks in the low-voltage power domain to reduce overall power consumption, especially for deep sub-micron system-on-a-chip (SOC) designs and the like. For data converter designs, it is preferable to place the bandgap reference in the low-voltage domain if the noise budget can meet requirements. FIG. 1 shows elements of a data converter 100 with a bandgap reference in the low-voltage domain according to some embodiments.

Referring to FIG. 1, data converter 100 includes a thin-oxide circuit 102 that includes a plurality of thin-oxide devices Mn powered by a relatively low voltage VDD1, a thick-oxide circuit 104 that includes a plurality of thick-oxide devices Mk powered by a relatively high voltage VDD2, and a protection circuit 106 configured to protect thin-oxide circuit 102 from high voltage VDD2.

Thin-oxide circuit 102 includes a bandgap circuit 108 that provides reference voltages vbnc and vbn to a current mirror constructed from four thin-oxide NMOS MOSFETs Mn0, Mn1, Mn2, and Mn3. In particular, bandgap circuit 108 provides reference voltage vbnc to the gates of devices Mn0 and Mn2, and provides reference voltage vbn to the gates of devices Mn1 and Mn3. The sources of devices Mn0 and Mn2 are electrically coupled to the drains of devices Mn1 and Mn3. The sources of devices Mn1 and Mn3 are electrically coupled to voltage VSS.

Thick-oxide circuit 104 includes a current mirror constructed from eight thick-oxide PMOS MOSFETs Mk2, Mk3, Mk4, Mk5, Mk6, Mk7, Mk8, and Mk9. The sources of devices Mk3, Mk5, Mk7, and Mk9 are electrically coupled to high voltage VDD2. The sources of devices Mk2, Mk4, Mk6, and Mk8 are electrically coupled to the drains of devices Mk3, Mk5, Mk7, and Mk9. The drains of devices Mk6 and Mk8 provide currents I1 and I2, respectively. The gates of devices Mk5, Mk7, and Mk9 are electrically coupled to the drain of device Mk4. The gates of devices Mk2, Mk3, Mk4, Mk6, and Mk8 are electrically coupled to the drain of device Mk2.

Protection circuit 106 includes two thick-oxide NMOS MOSFETs Mk0 and Mk1. The gates of devices Mk0 and Mk1 are electrically coupled to low voltage VDD1. The drains of devices Mk0 and Mk1 are electrically coupled to the drains of devices Mk2 and Mk4, respectively, of thick-oxide circuit 104. The sources of devices Mk0 and Mk1 are electrically coupled to the drains of devices Mn0 and Mn2, respectively, of thin-oxide circuit 102.

In normal operation, the drain voltages of devices Mn0 and Mn1 are kept one threshold plus overdrive below voltage VDD1, which is within the safe operation zone. In the initial power-up sequence, the drain voltages of devices Mn0 and Mn1 are kept below voltage VDD1 no matter which power supply (VDD1 or VDD2) is up first, thereby providing over-voltage protection to thin-oxide circuit 102 in all cases.

Figure 2:
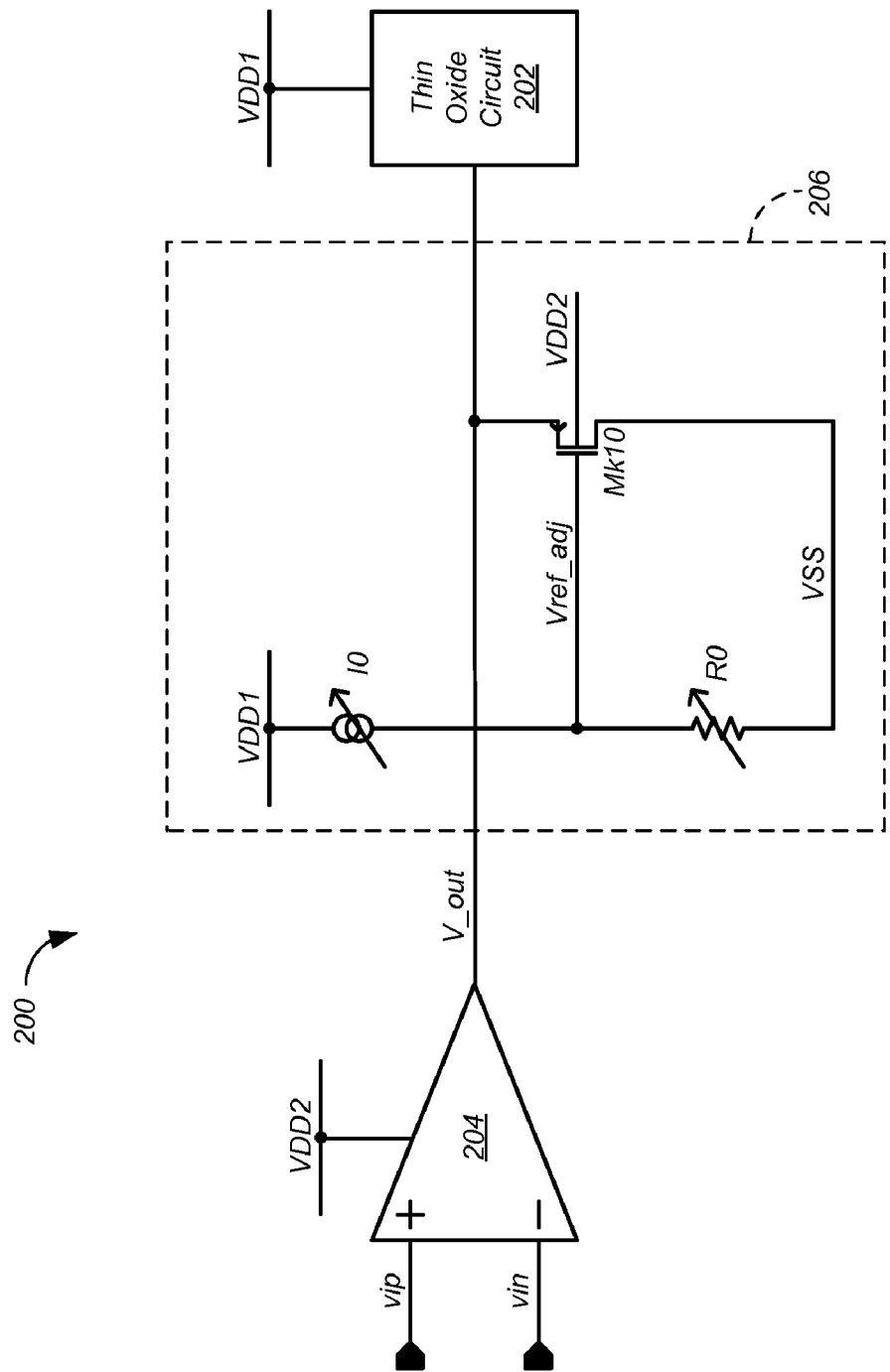
FIG. 2 shows elements of a data converter with over-voltage protection for blocks driven by an amplifier powered by a relatively high voltage.

If a larger voltage swing signal is needed for inter-chip communication, a higher power supply VDD2 is needed to drive the interface domain. One protection challenge in this case is the interface between the VDD2 domain and the VDD1 domain. FIG. 2 shows elements of a data converter 200 with over-voltage protection for blocks driven by an amplifier powered by a relatively high voltage VDD2.

Referring to FIG. 2, data converter 200 includes a thin-oxide circuit 202 powered by a relatively low voltage VDD1, an amplifier 204 powered by relatively high voltage VDD2 and providing an output voltage V_out to thin-oxide circuit 202, and a protection circuit 206 to protect thin-oxide circuit 202 from over-voltage conditions caused by amplifier 204.

Protection circuit 206 includes a thick-oxide PMOS MOSFET Mk10 and a voltage reference circuit that includes an adjustable current source I0 electrically coupled to voltage VDD1 and an adjustable resistor R0 electrically coupled between adjustable current source I0 and voltage VSS. The voltage vref_adj across adjustable resistor R0 is provided to the gate of device Mk10. The source of device Mk10 is electrically coupled to the output of amplifier 204. The drain of device Mk10 is electrically coupled to voltage VSS. The substrate of device Mk10 is biased with voltage VDD2.

Device Mk10 is used as a clamp circuit in this approach. In order to keep amplifier output V_out within a safe operation range to meet the linearity requirements of data converter 200 for different operation modes, the gate of device Mk10 should be properly biased by voltage vref_adj. In these applications, adjustable current source I0 and adjustable resistor R0 provide multiple selections for different application modes. Because the substrate of device Mk10 is biased with the highest voltage in the system, the Nwell associated with device Mk10 is not reverse-biased in normal operation. During power-up with voltage VDD2 rising faster than voltage VDD1, voltage vref_adj is pulled down to ground by adjustable resistor R0, keeping voltage V_out below one threshold plus overdrive. In the case where voltage VDD1 rises faster than voltage VDD2, the Nwell associated with device Mk10 is charged by voltage VDD1 by forward biasing. Thus protection circuit 206 is ready before voltage VDD2 is up.

For differential operation, the amplifier 204 of FIG. 2 is replaced with an amplifier having differential outputs. In these cases, a similar approach is employed.

Figure 3:
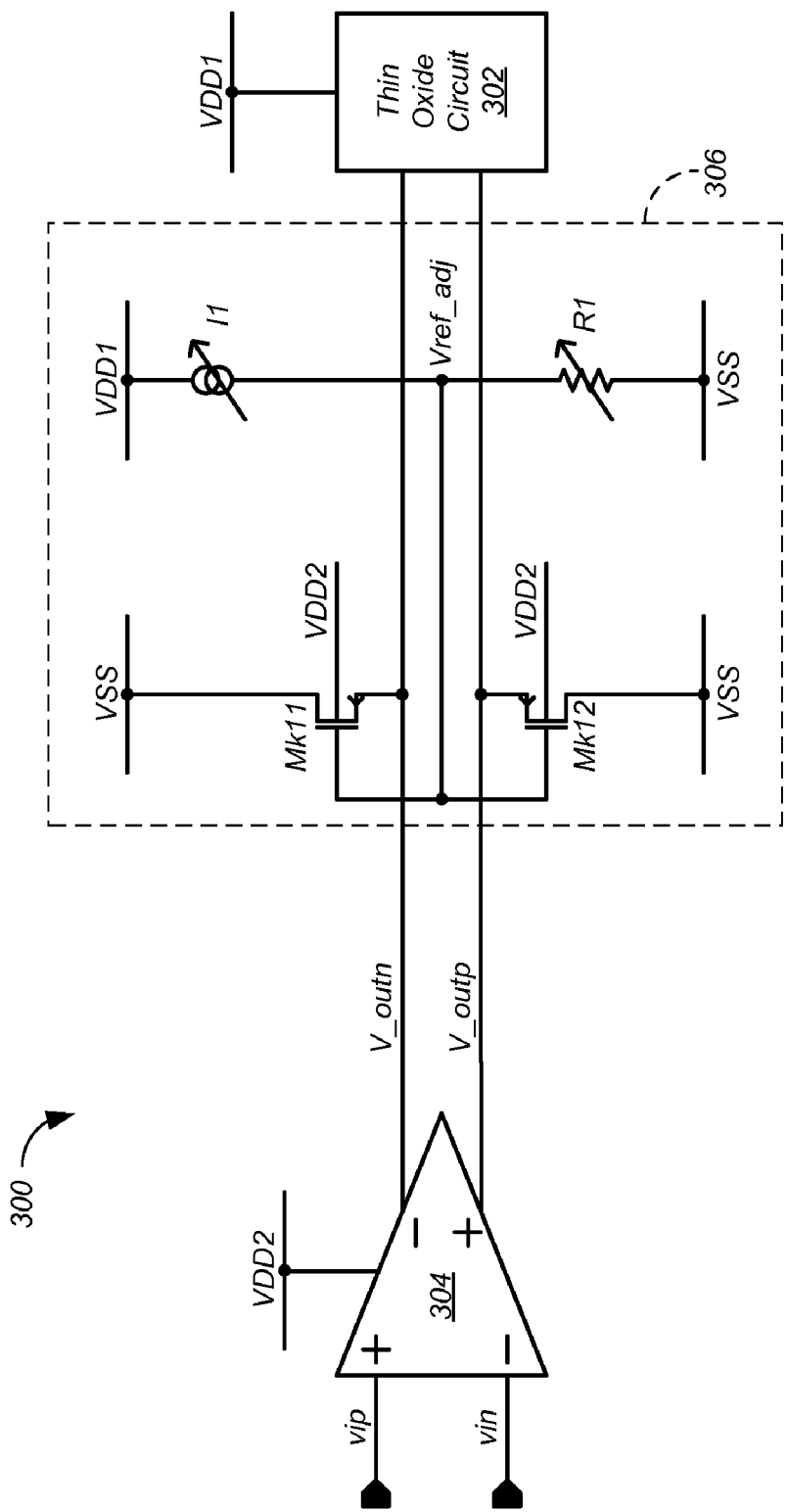
FIG. 3 shows elements of a data converter with over-voltage protection for blocks driven by an amplifier with differential outputs powered by a relatively high voltage.

FIG. 3 shows elements of a data converter 300 with over-voltage protection for blocks driven by an amplifier with differential outputs powered by a relatively high voltage VDD2.

Referring to FIG. 3, data converter 300 includes a thin-oxide circuit 302 powered by a relatively low voltage VDD1, an amplifier 304 powered by relatively high voltage VDD2 and providing output voltages V_outn and V_outp to thin-oxide circuit 302, and a protection circuit 306 to protect thin-oxide circuit 302 from over-voltage conditions caused by amplifier 304.

Protection circuit 306 includes two thick-oxide PMOS MOSFETs Mk11 and Mk12 and a voltage reference circuit that includes an adjustable current source I1 electrically coupled to voltage VDD1 and an adjustable resistor R1 electrically coupled between adjustable current source I1 and voltage VSS. The voltage vref_adj across adjustable resistor R1 is provided to the gates of devices Mk11 and Mk12. The sources of devices Mk11 and Mk12 are electrically coupled to the negative and positive outputs of amplifier 304, respectively. The drains of devices Mk11 and Mk12 are electrically coupled to voltage VSS. The substrates of devices Mk11 and Mk12 are biased with voltage VDD2.

Devices Mk11 and Mk12 are used as a clamp circuit that operates in a manner similar to the clamp circuit of FIG. 2. For high linearity requirements, the gate voltages of devices Mk11 and Mk12 should be well defined to avoid any linearity degradation.

Figure 4:
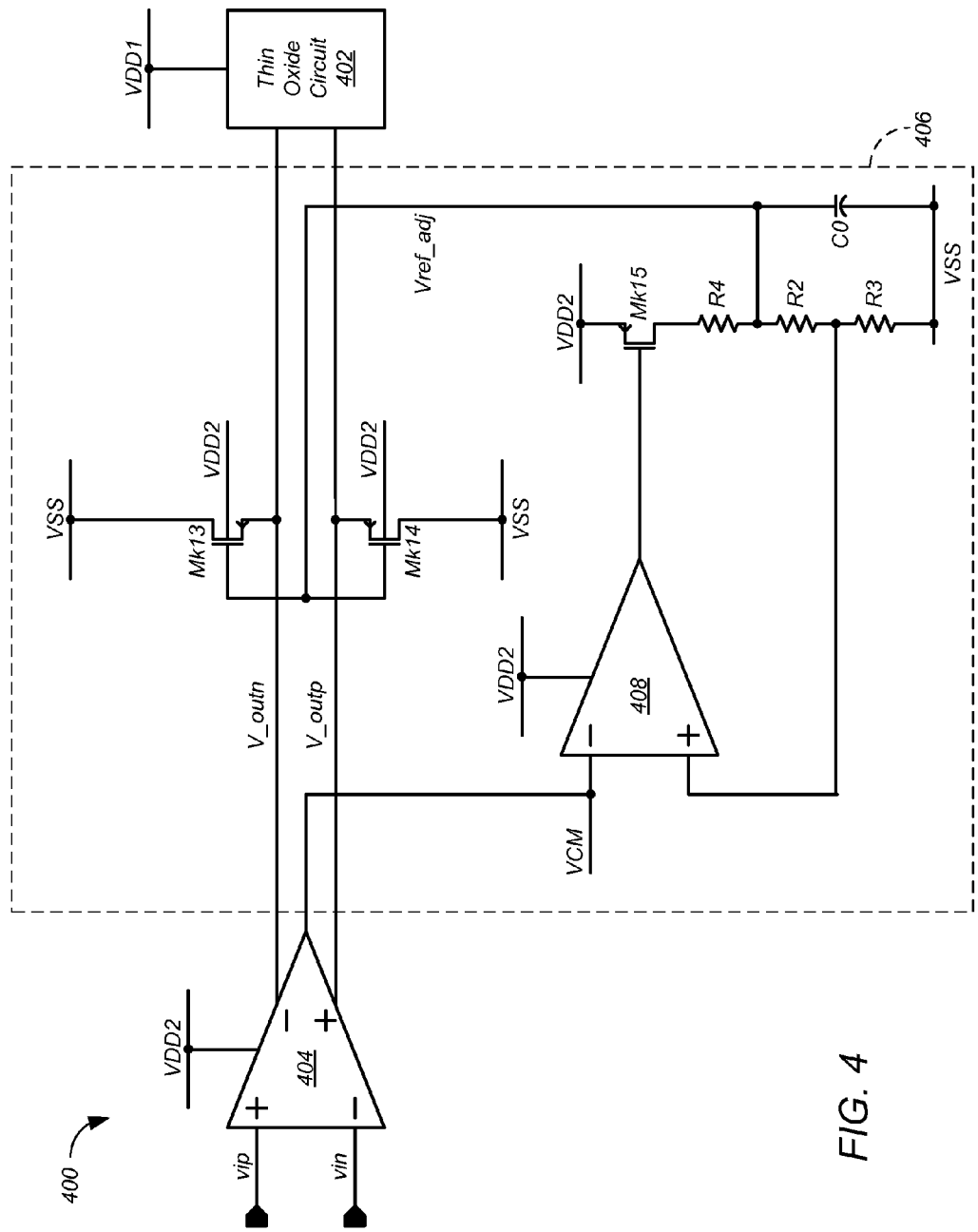
FIG. 4 shows elements of a data converter with over-voltage protection and common mode tracking for blocks driven by an amplifier with differential outputs powered by a relatively high voltage.

If the common mode output of the differential amplifier will change in different situations, automatic tracking of this common mode is used for the protection circuit. FIG. 4 shows elements of a data converter 400 with over-voltage protection and common mode tracking for blocks driven by an amplifier with differential outputs powered by a relatively high voltage VDD2.

Referring to FIG. 4, data converter 400 includes a thin-oxide circuit 402 powered by a relatively low voltage VDD1, an amplifier 404 powered by relatively high voltage VDD2 and providing output voltages V_outn and V_outp to thin-oxide circuit 402, and a protection circuit 406 to protect thin-oxide circuit 402 from over-voltage conditions caused by amplifier 404.

As with data converter 300 of FIG. 3, protection circuit 406 includes a clamp circuit including one of thick-oxide PMOS MOSFETs Mk13 and Mk14. In contrast to data converter 300 of FIG. 3, the voltage reference circuit is adaptive, and includes a buffer amplifier 408, a resistor divider R2, R3, R4 and by-pass capacitor C0, and a thick-oxide PMOS MOSFET Mk15.

Buffer amplifier 408 is powered by voltage VDD2, and drives the gate of device Mk15. The source of device Mk15 is electrically coupled to voltage VDD2. The drain of device Mk15 is electrically coupled to the resistor divider. The common node of resistors R4 and R2 provides adaptive reference voltage vref_adj to the clamp circuit, and is electrically coupled to voltage VSS by capacitor C0. The positive input of buffer amplifier 408 is electrically coupled to the common node of resistors R2 and R3. The negative input of buffer amplifier 408 is driven by the common mode output VCM of differential amplifier 404.

The common mode output of differential amplifier 404 is controlled by a common-mode feedback amplifier which takes a fixed DC voltage. A low-offset singe-ended buffer amplifier 408 is used here to generate voltage vref_adj with a fixed ratio determined by resistors R2 and R3. By-pass capacitor C0 is used to stabilize reference voltage vref_adj.

Figure 5:
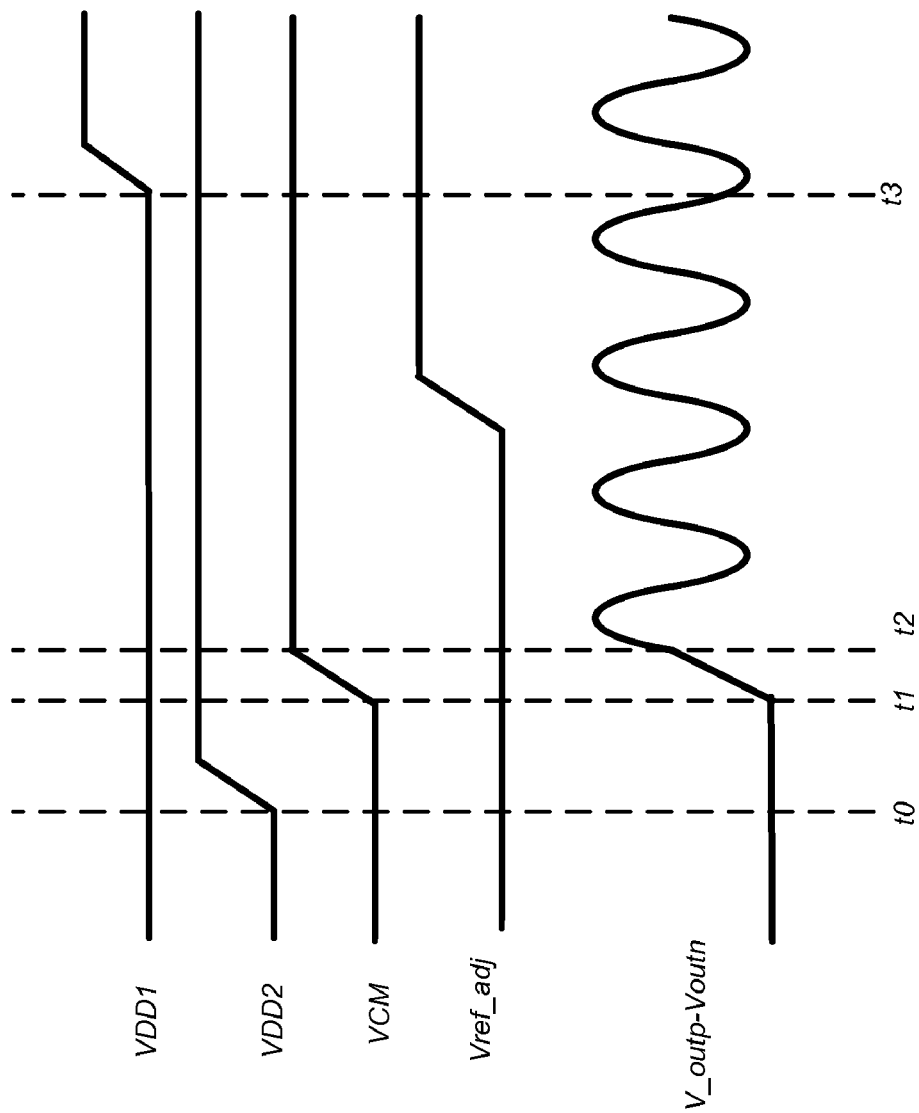
FIG. 5 is a timing diagram showing the relationships of the signal waveforms of the electrical circuit in FIG. 4 according to some embodiments when VDD2 ramps up faster than VDD1.

FIG. 5 is a timing diagram showing the relationships of the signal waveforms of the circuit in FIG. 4 according to some embodiments when VDD2 ramps up faster than VDD1. Referring to FIG. 5, VDD2 begins to rise at time t0, while VDD1 does not begin to rise until time t3. In response to the rise of VDD2, common mode voltage VCM begins to rise at time t1, and is ready at time t2, after VDD2 ramps up to its settled value.

During power-up with voltage VDD2 rising faster than voltage VDD1, voltage vref_adj is pulled down to ground by resistors R2 and R3 with the help of capacitor C0. The differential output V_outp-V_outn of amplifier 404 has full swing when the output common voltage VCM settles. However without proper biasing of the clamp circuit, the linearity of the differential output won't meet requirements because the differential output is distorted by the clamp circuit. This problem is addressed by biasing the gates of devices Mk13 and Mk14 to the proper voltage so that the differential output of amplifier 404 has sufficient voltage swing range for good linearity.

Reference voltage Vref adj is ready after some delay, and then the protection scheme starts to function before VDD1 begins to rise. Because the protection PMOS diodes are off during the normal operation, there is no straight bandwidth requirement for the buffer amplifier loop. The additional power overhead from buffer amplifier 408 is small relative to the entire system.

A number of implementations of the disclosure have been described. Nevertheless, it will be understood that various modifications may be made without departing from the spirit and scope of the disclosure. Accordingly, other implementations are within the scope of the following claims.

What is claimed is:

1. A data converter comprising:
   a high-voltage input configured to receive a differential high voltage signal into the data converter;
   a low-voltage input configured to receive a differential low voltage signal into the data converter;
   a thin-oxide circuit comprising a thin-oxide metal-oxide-semiconductor field-effect transistor (MOSFET); and
   a protection circuit configured to protect the thin-oxide circuit from the high voltage, wherein the protection circuit comprises
   a differential thick-oxide MOSFET clamp circuit, and
   an adaptive voltage reference circuit configured to provide an adaptive reference voltage, wherein the differential thick-oxide MOSFET clamp circuit is biased by the adaptive reference voltage.

2. The data converter of claim 1, further comprising:
   a first amplifier powered by the high voltage, wherein the first amplifier comprises differential output electrically coupled to the thin-oxide circuit;
   wherein the thick-oxide MOSFET clamp circuit comprises two thick-oxide MOSFETs, wherein sources of the thick-oxide MOSFETs are electrically coupled to the output of the first amplifier, and wherein the adaptive voltage reference circuit provides the adaptive reference voltage to gates of the thick-oxide MOSFETs.

3. The data converter of claim 2, wherein the adaptive voltage reference circuit further comprises:
   a second amplifier powered by the high voltage signal, wherein a common-mode output of the first amplifier is electrically coupled to a positive input of the second amplifier.

4. The data converter of claim 3, wherein the adaptive voltage reference circuit further comprises:
   a further thick-oxide MOSFET;
   wherein a source of the further thick-oxide MOSFET is electrically coupled to the high voltage input; and
   wherein an output of the second amplifier is electrically coupled to a gate of the further thick-oxide MOSFET.

5. An integrated circuit comprising the data converter of claim 1.

* * * * *